(12) United States Patent
Liu et al.

(10) Patent No.: US 7,897,986 B2
(45) Date of Patent: Mar. 1, 2011

(54) MICROLENS ARRAY AND IMAGE SENSING DEVICE USING THE SAME

(75) Inventors: Wu-Chieh Liu, Keelung (TW); Chin-Poh Pang, Hsinchu (TW); Chi-Xiang Tseng, Hsinchu (TW); Cheng-Lin Yang, Hsinchu (TW)

(73) Assignee: VisEra Technologies Company Limited, Hsinchu Science Park (TW)

( * ) Notice: Subject to any disclaimer, the term of this patent is extended or adjusted under 35 U.S.C. 154(b) by 176 days.

(21) Appl. No.: 12/104,941

(22) Filed: Apr. 17, 2008

(65) Prior Publication Data

US 2009/0261439 A1      Oct. 22, 2009

(51) Int. Cl.
*H01L 31/0232* (2006.01)
*H01L 27/146* (2006.01)
*H01L 33/00* (2006.01)

(52) U.S. Cl. .................. 257/98; 257/184; 257/432; 257/431

(58) Field of Classification Search .......... 257/E31.001, 257/184–186, 431–444, 98
See application file for complete search history.

(56) References Cited

U.S. PATENT DOCUMENTS

| | | | |
|---|---|---|---|
| 6,638,786 B2 | 10/2003 | Yamamoto | |
| 7,505,206 B2 | 3/2009 | Deng et al. | |
| 2007/0181785 A1* | 8/2007 | Helbing et al. | 250/221 |
| 2008/0007839 A1* | 1/2008 | Deng et al. | 359/642 |
| 2008/0011936 A1 | 1/2008 | Kuo et al. | |
| 2009/0200623 A1* | 8/2009 | Qian et al. | 257/432 |
| 2009/0242735 A1 | 10/2009 | Masuyama et al. | |

FOREIGN PATENT DOCUMENTS

| | | |
|---|---|---|
| CN | 1501507 | 6/2004 |
| CN | 101080818 | 11/2007 |
| CN | 101105543 | 1/2008 |
| CN | 101106145 | 1/2008 |
| EP | 1041405 A1 | 10/2000 |

* cited by examiner

*Primary Examiner*—Lynne A Gurley
*Assistant Examiner*—Naima J Kearney
(74) *Attorney, Agent, or Firm*—Muncy, Geissler, Olds & Lowe, PLLC (57) ABSTRACT

A microlens array is provided, including a base layer with a plurality of first microlenses formed over a first region thereof, wherein the first microlenses are formed with a first height. A plurality of second microlenses are formed over a second region of the base layer, wherein the second region surrounds the first region and the second microlenses are formed with a second height lower than the first height. A plurality of third microlenses are formed over a third region of the base layer, wherein the third region surrounds the second and three regions, and the microlenses are formed with a third height lower than the first and second heights.

13 Claims, 7 Drawing Sheets

MICROLENS ARRAY AND IMAGE SENSING DEVICE USING THE SAME

BACKGROUND OF THE INVENTION

1. Field of the Invention

The invention relates to a microlens array used in optical systems, and in particular to a micolens array used in an image sensing device for correcting aberration such as light field curvature caused by the focal length differences of the microlenses therein.

2. Description of the Related Art

Solid state sensing devices, including charge coupled devices (CCD) and CMOS sensors, are commonly used in photo-imaging applications. A solid state sensing device includes an array of imaging pixels. Each of the pixels includes a photovoltaic device for converting light energy to electrical signals. The photovoltaic device can be a photogate, photoconductor, or a photodiode having a doped region for accumulating photo-generated charge.

Microlenses are commonly placed in a corresponding array over the imaging pixels. A microlens is used to focus light onto the charge accumulation region of the imaging pixels. Conventional technology forms microlenses from photoresist material which is patterned into squares or circles provided respectively over the imaging pixels. The patterned photoresist material is then heated during manufacturing to shape and cure the microlenses. Typically, the microlenses in the microlens array formed over the imaging pixels are of same radius, shape and height, and are arranged in fixed pitches. Use of microlenses significantly improves the photosensitivity and efficiency of the imaging device by collecting light from a large light collecting region and focusing it on a small photosensitive region of the pixel.

Nevertheless, as pixel size decreases and pixel density increases, use of the microlens array over the imaging pixels having microlenses of same radius, shape, height and fixed pitches have resulted in difficulty of the microlenses to focus incident light rays onto the photosensitive regions near an edge portion of the pixel array, thereby causing a light field curvature therein. This problem is due in part to incident light diffraction on the microlenses in different regions, thus causing variations of focal length of the microlenses in different regions, thereby forming image distortions in multiple regions above the photosensitive region.

BRIEF SUMMARY OF THE INVENTION

Microlens arrays and image sensing devices are provided.

An exemplary microlens array comprises a base layer with a plurality of first microlenses formed over a first region thereof, wherein the first microlenses are formed with a first height. A plurality of second microlenses are formed over a second region of the base layer, wherein the second region surrounds the first region and the second microlenses are formed with a second height lower than the first height. A plurality of third microlenses are formed over a third region of the base layer, wherein the third region surrounds the second and first regions, and the microlenses are formed with a third height lower than the first and second heights.

An exemplary image sensing device comprises a substrate with a plurality of photosensors therein. An intervening layer is formed over the substrate, covering the photosensors therein. A passivation layer is formed over the intervening layer and a microlens array is formed over the passivation layer, wherein the base layer is the passivation layer, and the microlens array comprises a plurality of first, second and third microlenses of different heights aligned to one of the photosensors in the substrate, respectively.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
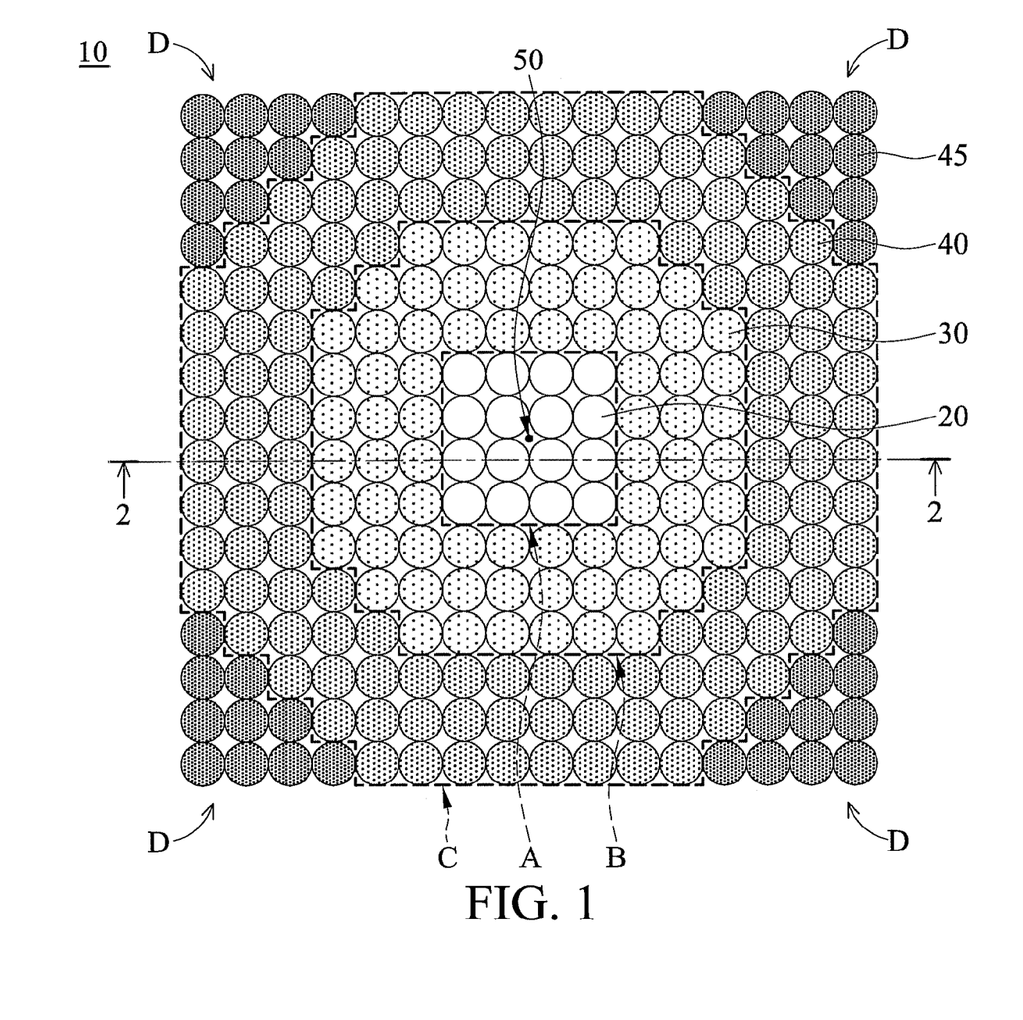
FIG. 1 is schematic diagram showing a top view of an image sensing device according to an embodiment of the invention.
Figure 2:
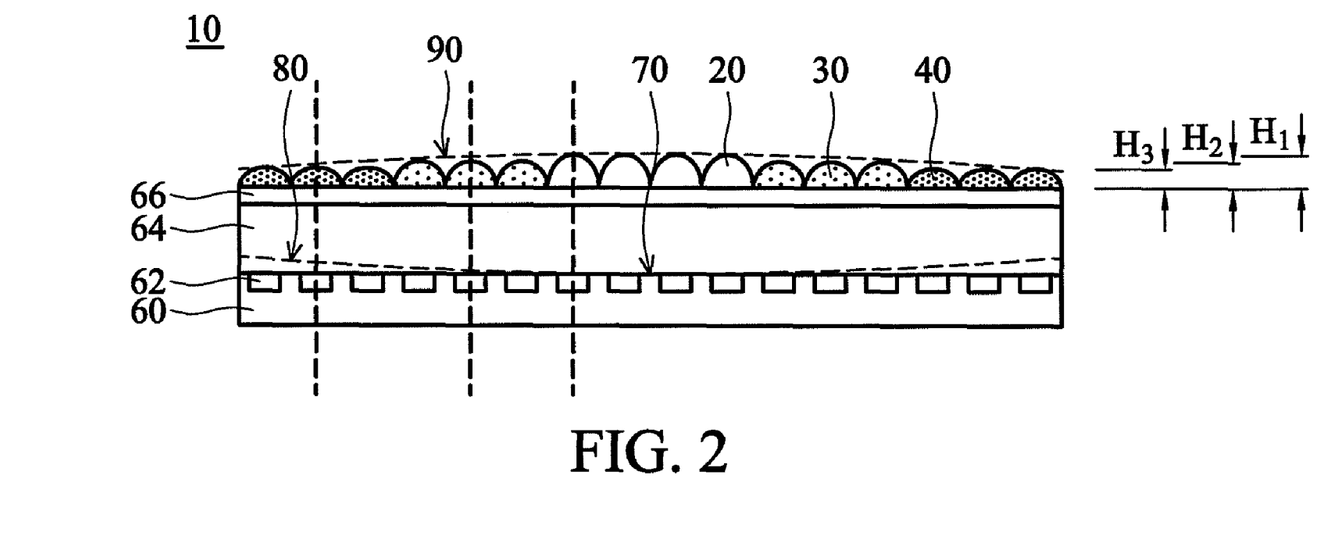
FIG. 2 is a schematic diagram showing a cross section taken along line 2-2 in FIG. 1, showing a part of the image sensing device.

Referring to FIGS. 1 and 2, an exemplary embodiment of an image sensing device 10 is shown illustratively in top and cross sectional views, respectively. A plurality of microlenses 20, 30, 40 and 45 having various heights are provided and concentrically arranged in one of the regions A, B, C and D defined over a passivation layer 66 of the image sensing device 10 against a center 50 thereof. The image sensing device 10 is illustrated with a 16×16 rectangular image pixel array, but is not limited thereto. The image sensing device 10 can be formed of an image pixel array arranged in other configurations, having more or less pixel numbers. In FIG. 1, only microlenses 20, 30, 40 and 45 are illustrated and other elements of the image sensing device 10 are shown in FIG. 2 which shows a cross section taken along line 2-2 in FIG. 1.

Referring to FIGS. 1 and 2, the microlenses 20 are formed over the region A defined over the passivation layer 66, the microlenses 30 are formed over the region B defined over the passivation layer 66, and the microlenses 40 are formed over the region C defined over the passivation layer 66, having different height $H_1$, $H_2$ or $H_3$, respectively. The microlenses 45 are formed over the region D, having a height $H_4$ (not shown) different from $H_1$, $H_2$ or $H_3$. The microlenses 20, 30, 40 and 45 may comprise photoresist material and can be formed by well known methods. The microlenses 20, 30, 40 and 45 are arranged as concentric arrays against a center of the image sensing device 50, respectively having a rectangular or a substantially cross top view, but is not limited thereto. The microlenses 20, 30, 40 and 45 can be also arranged as concentric arrays against the center 50 of the image sensing device having a top view with other configurations. In FIG. 2, only the microlenses 20, 30 and 40 are shown for illustration and the image sensing device 10 further includes an intervening layer 64 (e.g., color filter array, metallization, etc.) provided under the passivation layer 66, and an array of imaging pixels 62 formed in a substrate 60 with one microlens 20, 30 or 40 respectively formed thereover to increase the pixel's light collection efficiency. As shown in FIG. 2, the microlenses 20, 30 and 40 are formed with dome shapes and the height $H_1$ of the microlenses 20 is greater than the height $H_2$ of the microlens 30 and the height $H_3$ of the microlens 40. The height $H_2$ of the microlens 30 is greater than the height $H_3$ of the microlens 40. In addition, the microlens 45 which surrounds the microlens 40 is formed with the height $H_4$ (not shown in FIG. 2) greater than the height $H_3$ of the microlens 40.

In the illustrated embodiment of FIGS. 1 and 2, by providing the microlenses 20, 30, 40 and 45 with various heights in one of the regions A, B, C and D, incident light from a larger arc can thus converge onto a light sensitive photosensor of each pixel 62 and an effective focal length of the microlenses in a relative edge region, e.g. the microlenses 30, 40 and 45 in the regions B, C and D, can be lengthened, thereby reducing focal length deviations between the microlenses 20, 30, 40 and 45, and providing a planar focal plane substantially parallel to a surface 70 of the substrate 60. In FIG. 2, a curve focal plane 80 which is obtained while providing only the microlenses 20 in the regions A, B, C and D is also illustrated. The image sensing device 10 is formed with the plane focal plane, so that a light ray (not shown) can be deflected onto the photosensor of pixel 62 near an edge from the outside of the region of pixel 62, increasing the percentage of incident light that reaches a corresponding photosensor of a pixel 62 near the edge portion.

Figure 7:
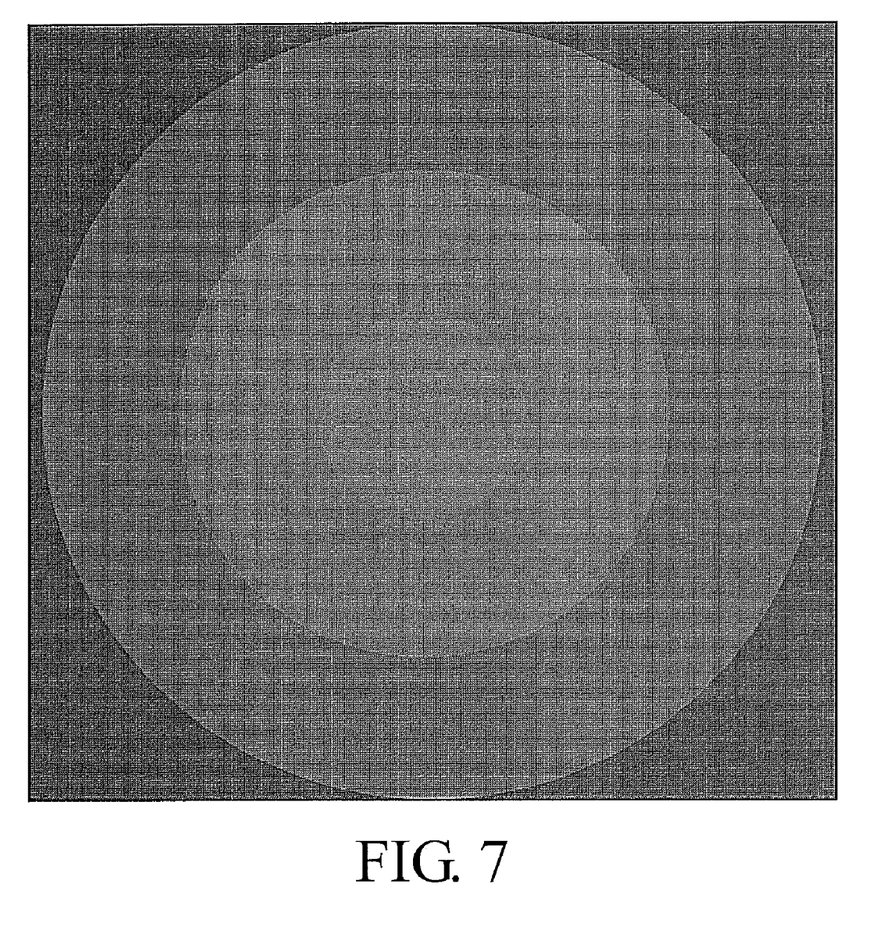
FIG. 7 is a schematic diagram showing a gray-level image of an image sensing device according to an embodiment of the invention.

FIG. 7 shows a gray-level image of the image sensing device 10 in FIGS. 1 and 2. A half-tone image with undesired shielding effect, however, does exist and a plurality of concentrically half-tone sub-images with obvious boundaries therebetween is obtained. An image with such defects is therefore provided by the image sensing device 10 and the undesired shielding effect should be eliminated.

Figure 3:
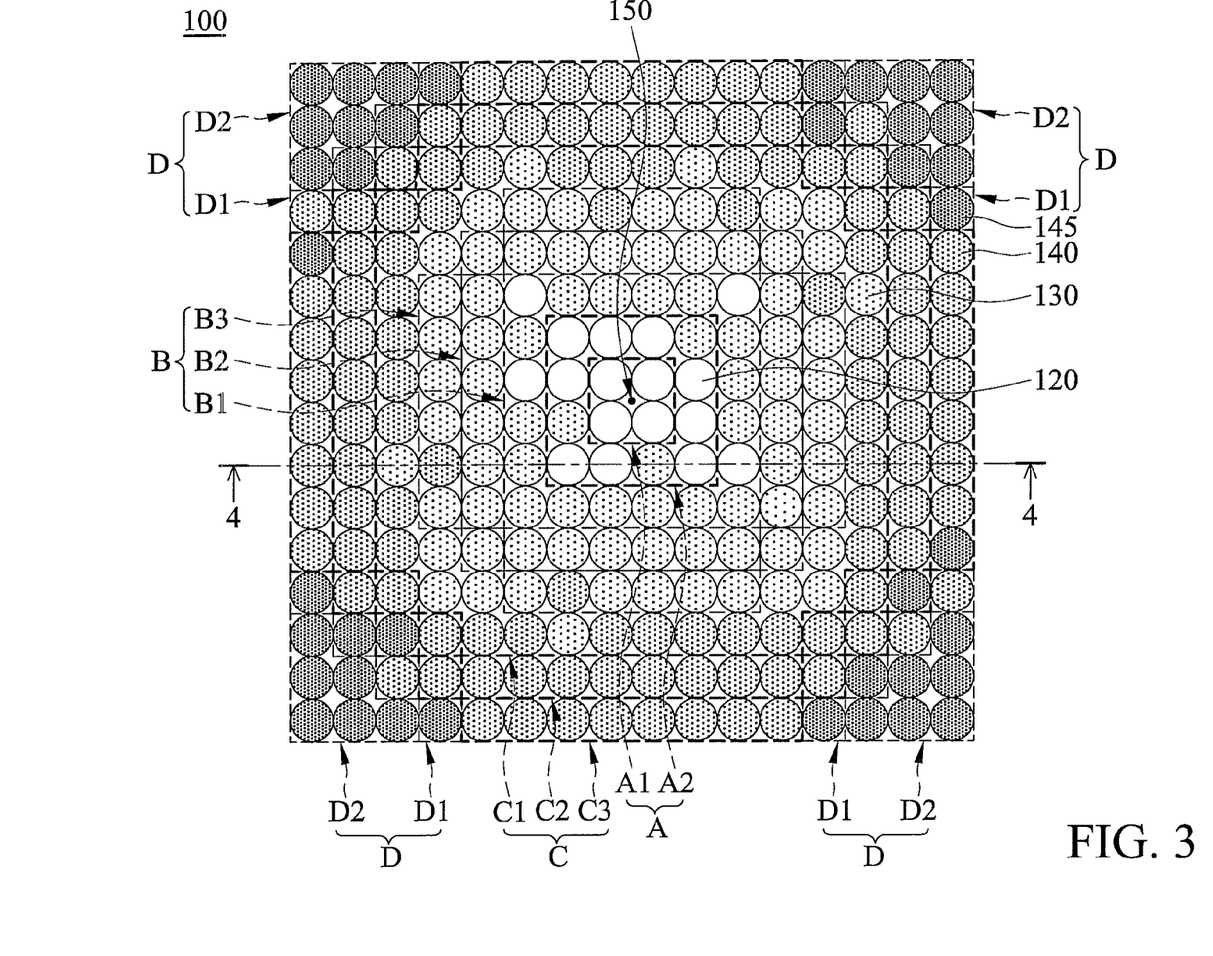
FIG. 3 is schematic diagram showing a top view of an image sensing device according to another embodiment of the invention.
Figure 4:
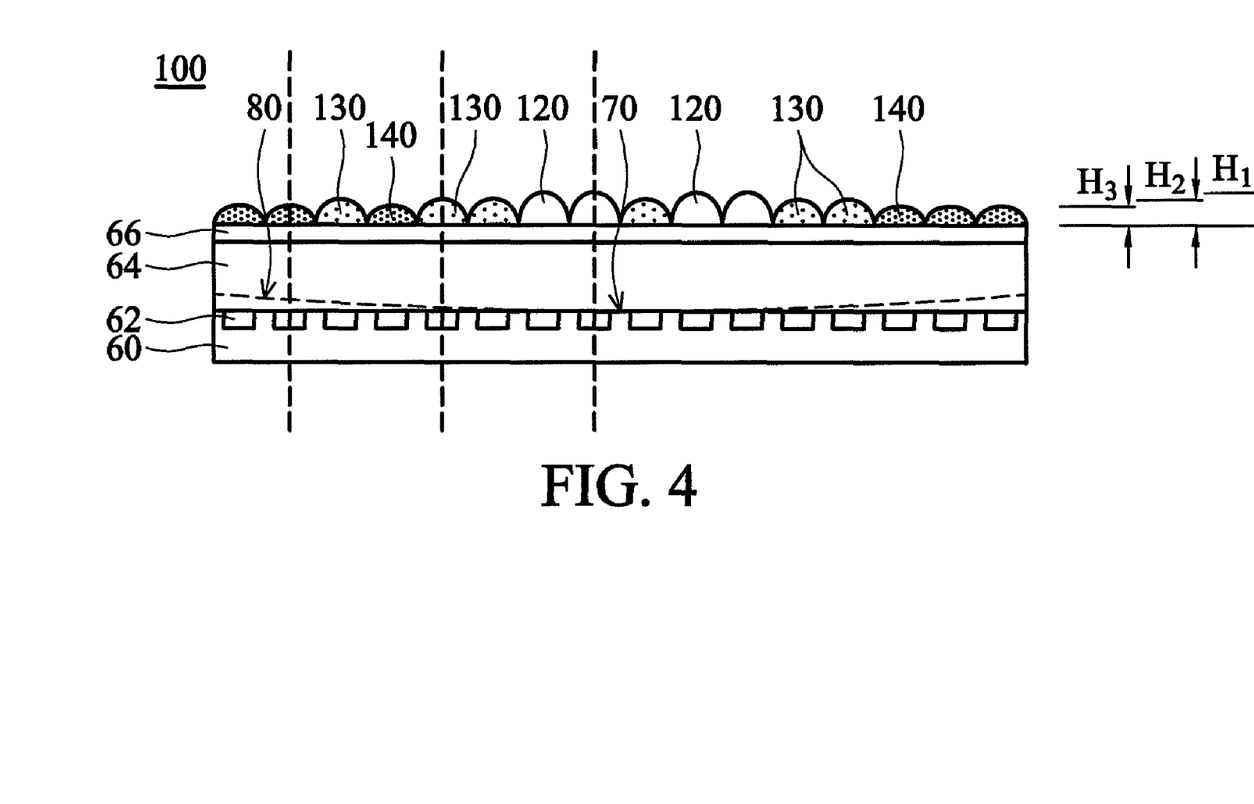
FIG. 4 is a schematic diagram showing a cross section taken along line 4-4 in FIG. 3, showing a part of the image sensing device.

As shown in FIGS. 3 and 4 another exemplary embodiment of an image sensing device 100 similar with that illustrated in FIGS. 1 and 2 is shown illustratively in top and cross sectional views, respectively, to resolve the image shielding effect found in gray-level image tests in the above embodiment. In this embodiment, similar components are represented as the same symbol as illustrated in FIGS. 1 and 2 and only differences therebetween the embodiments are discussed here.

As shown in FIGS. 3 and 4, a plurality of microlenses 120, 130, 140 and 145 having various heights are provided and concentrically arranged in one of the regions A, B, C and D defined over the passivation layer 66 of the image sensing device 100 against a center 150 thereof. The image sensing device 100 is still illustrated with a 16×16 rectangular image pixel array, but is not limited thereto. The image sensing device 100 can be formed of an image pixel array arranged in other configurations, having more or less pixel numbers. In FIG. 3, only microlenses 120, 130, 140 and 145 are illustrated and other components of the image sensing device 100 are shown in FIG. 4 which is a cross section taken along line 4-4 in FIG. 3.

Referring to FIGS. 3 and 4, the microlenses 120 are mainly formed over the region A defined over the passivation layer 66, the microlenses 130 are mainly formed over the region B defined over the passivation layer 66, the microlenses 140 are mainly formed over the region C defined over the passivation layer 66, and the microlenses 145 are mainly formed over the region D defined over the passivation layer 66, having different height $H_1$, $H_2$, $H_3$ or $H_4$. The microlenses 120, 130, 140 and 145 may comprise photoresist material and can be formed by well known methods. The microlenses 120, 130, 140 and 145 are arranged as concentric arrays against a center 150 of the image sensing device 100, respective having a rectangular or a substantially cross top view, but is not limited thereto. The microlenses 120, 130, 140 and 145 can be also arranged as concentric arrays against the center 150 of the image sensing device having a top view with other configurations.

As shown in FIG. 3, the region A is further defined with an inter sub-region A1 and an outer sub-region A2, wherein the sub-region A2 surrounds the sub-region A1 and is adjacent to the region B with the microlenses 130 formed therein. At this time, the sub-region A1 is only formed with the microlenses 120 and the sub-region A2 is interweaved with at least one microlens 130 which should be formed in the region B. In addition, the region B is further defined with an inter sub-region B1, an inter sub-region B2 and an outer sub-region B3, wherein the sub-region B3 surrounds the sub-region B2 and B1, and is adjacent to the region C with the microlenses 140 formed therein. At this time, the sub-region B1 is adjacent to the sub-region A2 of the region A and is not only formed with the microlenses 130 but also interleaved with at least one microlens 120. The sub-region B2 is optional and only formed with the microlenses 130 and the sub-region B3 is now interweaved with at least one microlens 140 which should be formed in the region C. Moreover, the region C is further defined with an inter sub-region C1, an inter sub-region C2 and an outer sub-region C3, wherein the sub-region C3 surrounds the sub-region C2 and C1, and is adjacent to an outer region (not shown) with the microlenses formed therein. At this time, the sub-region C1 is adjacent to the sub-region B3 of the region B and is not only formed with the microlenses 140 but also interleaved with at least one microlens 130. The sub-region C2 is optional and only formed with the microlenses 140 and the sub-region C3 is now interweaved with at least one microlens (not shown) which should be formed in an adjacent region (not shown). Moreover, the region D is further defined with an inter sub-region D1 and an outer sub-region D2, wherein the sub-region D1 substantially surrounds the sub-region C3, and is adjacent to the region C with the microlenses 140 formed therein. At this time, the sub-region C1 is not only formed with the microlenses 145 but also interleaved with at least one microlens 140.

Locations and amounts of the interleaved microlenses formed in the sub-regions A2, B1, B3, C1, C3 and D1 which near the boundary between the regions A, B, C and D can be previously determined by applying an error diffusion method to thereby reduce the image shielding effect induced by the undesired boundary between the regions A, B, C and D.

In the illustrated embodiment of FIGS. 3 and 4, by interleaving the microlenses 120, 130, 140 and 145 in an sub-region of one of the regions A, B, C and D, an effective focal length of the microlenses in a relative edge region, e.g. the microlenses 130 and 140 in the regions B, C and D, can be still lengthened, such that the focal length deviations between the microlenses 120, 130, 140 and 145 are reduced, and a planar focal plane substantially parallel to a surface 70 of the substrate 60 is provided. In FIG. 3, a curve focal plane 80 which is obtained while providing only the microlenses 120 in the regions A, B and C is also illustrated. The image sensing device 100 is formed with the plane focal plane, so that a light ray (not shown) can be deflected onto the photosensor of pixel 62 near an edge from the outside of the region of pixel 62, increasing the percentage of incident light that reaches a corresponding photosensor of a pixel 62 near the edge portion.

Figure 8:
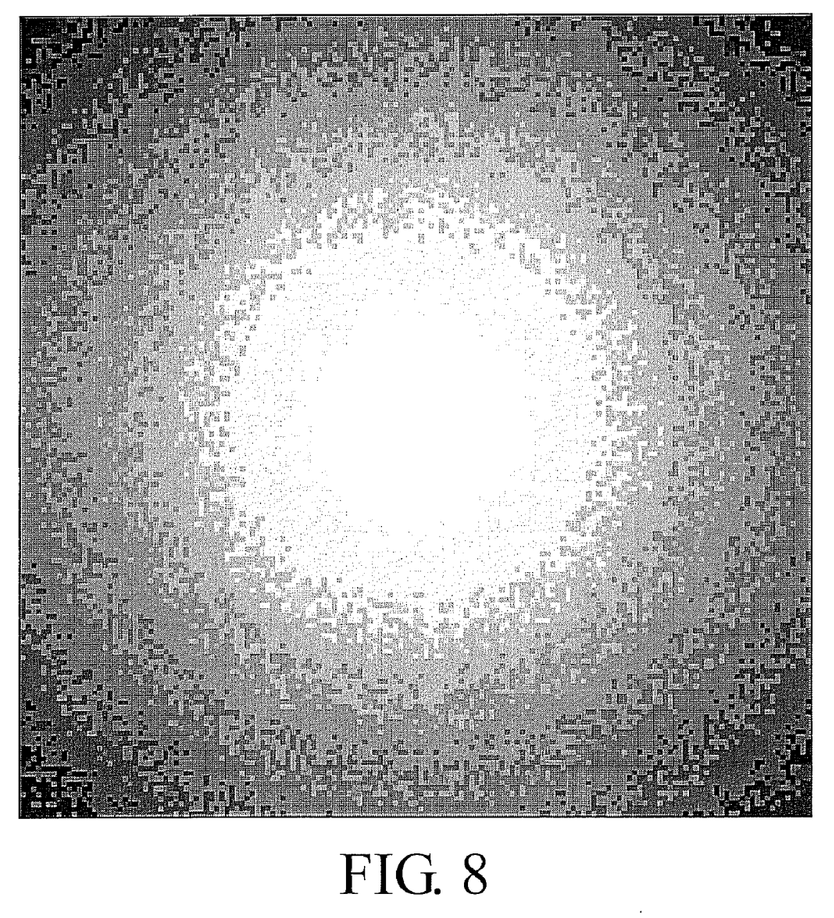
FIG. 8 is a schematic diagram showing a gray-level image of an image sensing device according to another embodiment of the invention.

FIG. 8 shows a gray-level image of the image sensing device 100 in FIGS. 3 and 4, a half-tone image without undesired shielding effect shown in FIG. 8, is shown and an plurality of concentrically half-tone sub-images with dithered boundary (the original boundary is illustrated in dashed-line) therebetween is obtained. An image with more smooth gray level performance is therefore provided by the image sensing device 100.

Figure 5:
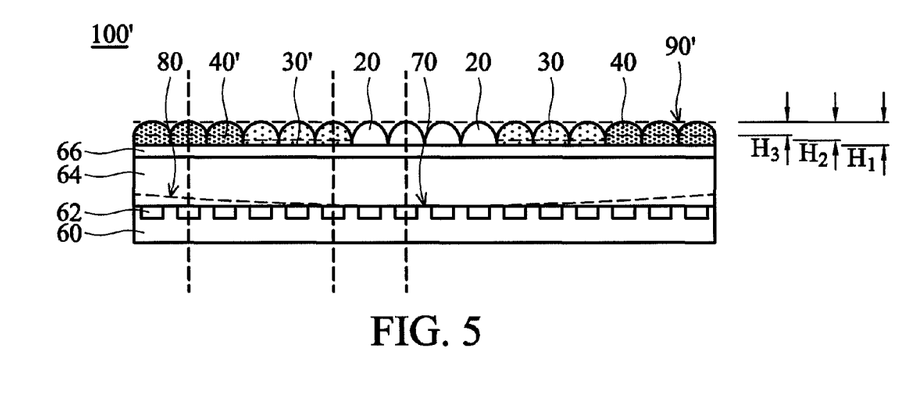
FIG. 5 is a schematic diagram showing a cross section of an image sensing device according to another embodiment of the invention.

FIG. 5 is a schematic diagram showing a cross section of an image sensing device 100' similar with that illustrated in FIG. 2, showing the regions A, B and C having modified microlenses therein. Herein, the same symbols represent the same components and only differences are discussed here. As shown in FIG. 5, the microlenses 30 and 40 are elevated by forming an elevating portion 30' and 40' thereunder, thereby providing an equalized top surface 90' formed by the microlenses 20, 30 and 40. The elevated portion 30' and 40' are also formed by conventional methods and materials as that for forming the microlens 30 and 40 shown in FIG. 1, and are formed during the forming of the dome shaped portion thereof at the same time, having a reduced height H2 and H3 less than the H1 of the microlenses 20.

Figure 6:
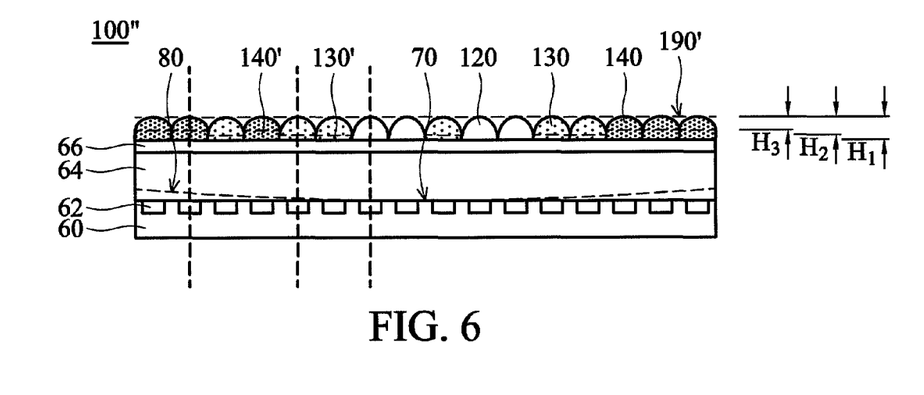
FIG. 6 is a schematic diagram showing a cross section of an image sensing device according to yet another embodiment of the invention.

FIG. 6 is a schematic diagram showing a cross section of an image sensing device 100" similar with that illustrated in FIG. 4, the regions A, B and C of having modified microlenses therein. Herein, the same symbol represents the same components and only differences are discussed here. As shown in FIG. 6, the microlenses 130 and 140 are elevated by forming an elevating portion 130' and 140' thereunder, thereby providing an equalized top surface 190' formed by the microlenses 120, 130 and 140. The elevated portion 130' and 140' are also formed by conventional methods and materials as that for forming the microlens 130 and 140 shown in FIG. 4, and are formed during the forming of the dome shaped portion thereof at the same time, having a reduced height $H_2$ and $H_3$ less than the $H_1$ of the microlenses 120.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A microlens array, comprising:
    a base layer;
    a plurality of first microlenses with a first height formed over a first region of the base layer;
    a plurality of second microlenses with a second height lower than the first height formed over a second region of the base layer, wherein the second region surrounds the first region; and
    a plurality of third microlenses with a third height lower than the first and second heights formed over a third region of the base layer, wherein the third region surrounds the second and first regions,
    wherein the first region comprises a first sub-region and a second sub-region, the first sub-region of the first region comprises only the first microlenses, and the second sub-region of the first region is adjacent to the second region and surrounds the first sub-region of the first region, and the second sub-region of the first region comprises at least one of the second microlenses.

2. The microlens array as claimed in claim 1, wherein the base layer is formed with a planar surface.

3. The microlens array as claimed in claim 1, wherein the first, second and third regions are concentrically arranged.

4. The microlens array as claimed in claim 1, wherein the second region comprises a first sub-region and a second sub-region, the first sub-region of the second region comprises at least one first microlens, the second sub-region of the second region is adjacent to the third region and surrounds the first sub-region of the second region, and the second sub-region of the second region comprises at least one of the third microlenses.

5. The microlens array as claimed in claim 4, wherein the second region further comprises a third sub-region formed between the first sub-region of the second region and the second sub-region of the second region, and the third sub-region of the second region only comprises only the second microlenses.

6. The microlens array as claimed in claim 4, wherein the third region comprises a first sub-region and a second sub-region, the first sub-region of the third region comprises at least one of the second microlens, the second sub-region of the third region surrounds the first sub-region of the third region, and the second sub-region of the third region comprises the third microlenses.

7. An image sensing device, comprising:
    a substrate with a plurality of photosensors therein;
    an intervening layer formed over the substrate, covering the photosensors therein;
    a passivation layer formed over the intervening layer; and
    a microlens array as claimed in claim 1 formed over the passivation layer, wherein the base layer is the passivation layer, and the first, second and third microlenses are aligned to one of the photosensors in the substrate, respectively.

8. The image sensing device as claimed in claim 7, wherein the passivation layer is formed with a planar surface.

9. The image sensing device as claimed in claim 7, wherein the first, second and third regions are concentrically arranged.

10. The image sensing device as claimed in claim 7, wherein the second region comprises a first sub-region and a second sub-region, the first sub-region of the second region comprises at least one first microlens, the second sub-region of the second region is adjacent to the third region and surrounds the first sub-region of the second region, and the second sub-region of the second region comprises at least one of the third microlenses.

11. The image sensing device as claimed in claim 7, wherein the second region further comprises a third sub-region formed between the first sub-region of the second region and the second sub-region of the second region, and the third sub-region of the second region comprises only the second microlenses.

12. The image sensing device as claimed in claim 11, wherein the third region comprises a first sub-region and a second sub-region, the first sub-region of the third region comprises at least one of the second microlenses, the second sub-region of the third region surrounds the first sub-region of the third region, and the second sub-region of the third region comprises the third microlenses.

13. The image sensing device as claimed in claim 11, wherein the photosensors comprise a photogate, photoconductor, or a photodiode, respectively.

* * * * *